(12) United States Patent
Song

(10) Patent No.: US 9,183,776 B2
(45) Date of Patent: Nov. 10, 2015

(54) ORGANIC LIGHT-EMITTING DIODE (OLED) DISPLAY

(71) Applicant: Samsung Display Co. Ltd., Yongin, Gyeonggi-Do (KR)

(72) Inventor: Sung-Hoon Song, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 37 days.

(21) Appl. No.: 14/095,863

(22) Filed: Dec. 3, 2013

(65) Prior Publication Data

US 2015/0009108 A1 Jan. 8, 2015

(30) Foreign Application Priority Data

Jul. 3, 2013 (KR) .................. 10-2013-0077940

(51) Int. Cl.
*G09G 3/32* (2006.01)
*H01L 27/12* (2006.01)

(52) U.S. Cl.
CPC ............ *G09G 3/3225* (2013.01); *H01L 27/124* (2013.01); *H01L 27/1222* (2013.01); *G09G 3/3233* (2013.01); *G09G 2300/043* (2013.01); *G09G 2300/0819* (2013.01); *G09G 2300/0842* (2013.01); *G09G 2300/0861* (2013.01); *G09G 2310/0251* (2013.01); *G09G 2310/0262* (2013.01); *G09G 2320/0223* (2013.01)

(58) Field of Classification Search
CPC ................... G09G 3/3233; G09G 2300/0842; G09G 2300/0819; G09G 2300/0861; G09G 2320/043; G09G 3/3225; G09G 2320/0233
See application file for complete search history.

(56) References Cited

U.S. PATENT DOCUMENTS

| | | | |
|---|---|---|---|
| 6,690,033 B2 * | 2/2004 | Yamazaki et al. | 257/72 |
| 6,806,904 B1 * | 10/2004 | Kim | 348/315 |
| 2003/0043327 A1 | 3/2003 | Aoyama et al. | |
| 2008/0017866 A1 * | 1/2008 | Sato | 257/72 |
| 2011/0090191 A1 * | 4/2011 | Lee et al. | 345/206 |
| 2012/0127413 A1 | 5/2012 | Shin et al. | |
| 2013/0082914 A1 * | 4/2013 | Matsumura et al. | 345/92 |
| 2014/0332761 A1 * | 11/2014 | Kim | 257/40 |

FOREIGN PATENT DOCUMENTS

| | | |
|---|---|---|
| KR | 10-2003-0023480 A | 3/2003 |
| KR | 10-2006-0081600 A | 7/2006 |
| KR | 10-2011-0041107 A | 4/2011 |
| KR | 10-2012-0054844 A | 5/2012 |

\* cited by examiner

*Primary Examiner* — Olga Merkoulova

(74) *Attorney, Agent, or Firm* — Knobbe, Martens, Olson & Bear, LLP

(57) ABSTRACT

An organic light-emitting diode (OLED) display is disclosed. In one aspect, the OLED display includes a plurality of scan lines extending in a first direction and a plurality of data lines extending in a second direction crossing the first direction. The OLED display also includes a plurality of pixels electrically connected to the scan lines and the data lines and arranged in a plurality of rows and columns, each pixel including an OLED and a thin film transistor electrically connected to the OLED. The OLED display further includes a plurality of driving voltage lines that supply a driving voltage to each of the pixels and extend in the second direction, wherein an active layer of a thin film transistor serpentinely extends along an inclined direction with respect to the second direction.

20 Claims, 10 Drawing Sheets

ORGANIC LIGHT-EMITTING DIODE (OLED) DISPLAY

CROSS-REFERENCE TO RELATED APPLICATIONS

This application claims the benefit of Korean Patent Application No. 10-2013-0077940, filed on Jul. 3, 2013, in the Korean Intellectual Property Office, the disclosure of which is incorporated herein in its entirety by reference.

BACKGROUND

1. Field

The described technology generally relates to an organic light-emitting diode (OLED) display.

2. Description of the Related Technology

Organic light-emitting diode (OLED) displays have been attracting attention due to their exceptional technical characteristics and application to commercial markets including portable electronic devices such as smartphones and tablet computers.

OLED displays generally have self light-emitting characteristics and do not require a separate light source unlike liquid crystal displays (LCDs), and thus, the thickness and weight of OLED displays can be relatively reduced. In addition, OLED displays generally have technical characteristics such as the ability to display high-definition images, low power consumption, high brightness, fast response speeds, and the like.

SUMMARY OF CERTAIN INVENTIVE ASPECTS

One inventive aspect is an OLED display in which an active layer of a driving thin film transistor is serpentinely formed in an inclined direction with respect to a driving voltage line which supplies a power source voltage ELVDD and a data line.

Another aspect is an OLED display including a plurality of scan lines extending in a first direction, a plurality of data lines extending in a second direction that is substantially orthogonal to the first direction, a plurality of pixels electrically connected to the scan lines and the data lines to form a plurality of rows and a plurality of columns, each pixel including an OLED and a thin film transistor electrically connected to the OLED, and a plurality of driving voltage lines supplying a driving voltage to each of the pixels and extending in the second direction, wherein an active layer of the thin film transistor serpentinely extends along an inclined direction with respect to the driving voltage lines and the data lines.

The active layer of the thin film transistor may include first, second, and third regions extending in one direction, a fourth region extending in an inclined direction with respect to the driving voltage lines and the data lines and connecting the first region to the second region, and a fifth region extending in the inclined direction with respect to the driving voltage lines and the data lines and connecting the second region to the third region.

The first, second, and third regions may extend in substantially the same direction as the first direction.

The inclined direction may make an acute angle with the second direction.

Active layers of thin film transistors included in two adjacent pixels disposed along the second direction may form a chevron shape.

Data lines for two adjacent pixels disposed along the first direction from may be substantially symmetrically mirrored about a boundary between the two adjacent pixels.

Driving voltage lines for two adjacent pixels disposed along the first direction may be substantially symmetrically mirrored about a boundary between the two adjacent pixels.

An active layer of a thin film transistor included in each of pixels disposed along the first direction forming an mth row (m is a natural number) may serpentinely extend along a third direction inclined with respect to the second direction, and an active layer of a thin film transistor included in each of pixels disposed along the first direction forming an (m+1)th row may serpentinely extend along a fourth direction inclined with respect to the second direction.

The third direction and the fourth direction may form a chevron shape.

The active layer of the thin film transistor may be an active layer of a driving thin film transistor.

Another aspect is an OLED display including a switching thin film transistor formed on a substrate and connected to a scan line extending in a first direction and to a data line extending in a second direction substantially orthogonal to the first direction, a driving voltage line extending in substantially the same direction as the data line, a driving thin film transistor electrically connected to the switching thin film transistor, and an OLED electrically connected to the driving thin film transistor, wherein the driving thin film transistor includes an active layer electrically connected between two pixels adjacent in the first direction and serpentinely extending along an inclined direction with respect to the driving voltage line and the data line.

Active layers of driving thin film transistors included in two pixels adjacent in the second direction may form a chevron shape.

The inclined direction against the driving voltage line and the data line may make an acute angle with the second direction.

The active layer may include first, second, and third regions extending in one direction, a fourth region extending in an inclined direction with respect to the driving voltage line and the data line and electrically connecting one end of the first region to one end of the second region, and a fifth region extending in an inclined direction with respect to the driving voltage line and the data line and electrically connecting the other end of the second region to one end of the third region.

An active layer of a driving thin film transistor included in pixels adjacently disposed along the first direction forming an mth row (m is a natural number) may serpentinely extend in a third direction inclined with respect to the driving voltage line and the data line, and an active layer of a driving thin film transistor included in pixels adjacently disposed along the first direction forming an (m+1)th row may serpentinely extend in a fourth direction inclined with respect to the driving voltage line and the data line.

The third direction and the fourth direction may form a chevron shape.

The OLED display may further include a first insulating layer substantially covering an active layer of the driving thin film transistor, and a capacitor substantially overlapping the active layer.

The capacitor may include a first capacitor electrode formed on the first insulating layer, substantially overlapping the active layer of the driving thin film transistor, and functioning as a gate electrode of the thin film transistor, a second insulating layer substantially covering the first capacitor electrode, and a second capacitor electrode formed on the second insulating layer, and at least a portion of which substantially overlaps the first capacitor electrode.

BRIEF DESCRIPTION OF THE DRAWINGS

The above and other features and advantages of the described technology will become more apparent by describing in detail exemplary embodiments thereof with reference to the attached drawings.

DETAILED DESCRIPTION OF CERTAIN INVENTIVE EMBODIMENTS

Figure 1:
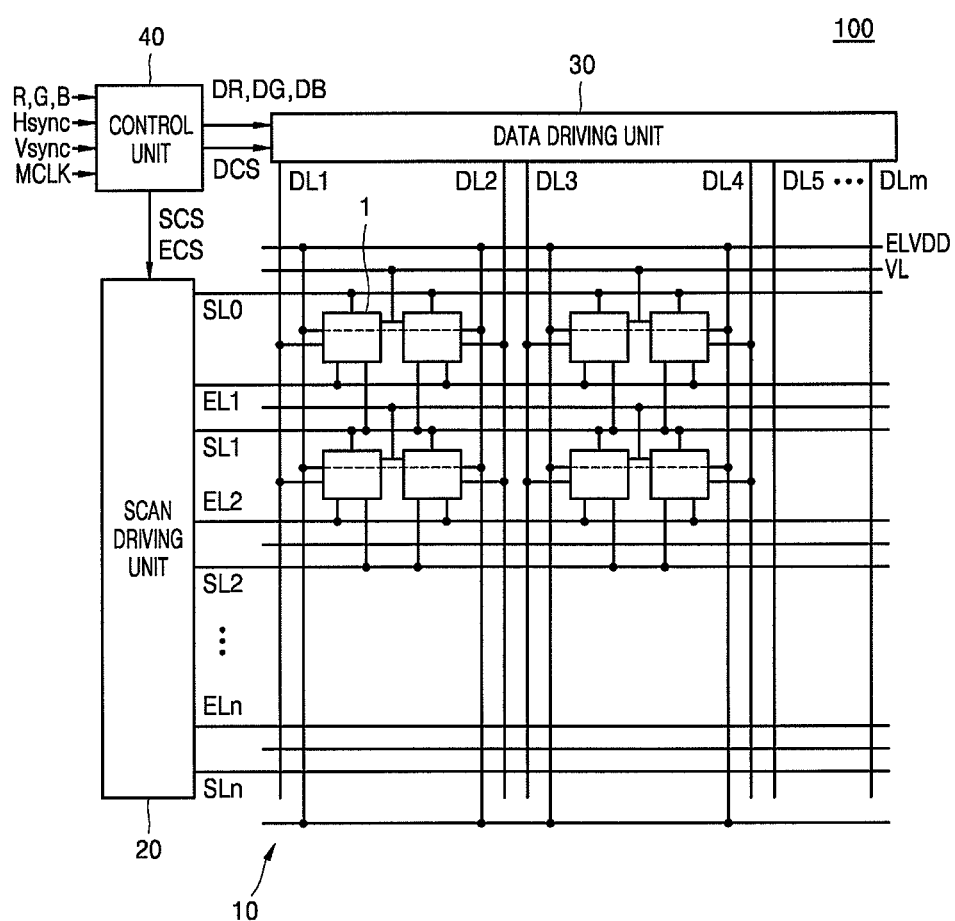
FIG. 1 is a block diagram of an OLED display according to an embodiment.

The described technology may allow for various changes, modifications, and specific embodiments will be illustrated in the drawings and described in detail in the specification. However, it should be understood that the specific embodiments described herein do not limit the described technology to the specific disclosed configurations but include various changes or modifications within the spirit and technical scope of the described technology. In the following description, well-known functions or constructions are not described in detail so as not to obscure the invention with unnecessary detail. Although terms, such as 'first' and 'second', may be used to describe various elements, the elements are not limited by these terms. The terms are only intended to distinguish a certain element from another element. The terminology used in the application is used only to describe specific embodiments and not intended to limit the described technology. Singular forms of expressions are intended to include the plural forms as well unless the context clearly indicates otherwise. In the specification, it should be understood that terms, such as "include" and "have", are used to indicate the existence of the identified feature, number, step, operation, element, part, or a combination thereof without excluding the possibility of the existence or addition of one or more other features, numbers, steps, operations, elements, parts, or combinations thereof.

In the drawings, the dimensions of layers or regions may be exaggerated to clearly illustrate the layers and regions. Like reference numerals throughout the specification designate like elements. When a part, such as a layer, film, region, plate, or the like, is described as being "on" or "above" another part, the part may be directly above the other part, or a third part may be interposed therebetween.

As used herein, the term "and/or" includes any and all combinations of one or more of the associated listed items.

FIG. 1 is a block diagram illustrating an OLED display 100 according to an embodiment of the described technology.

The OLED display 100 (hereinafter, interchangeably referred to as "display apparatus") includes a display unit 10 including a plurality of pixels, a scan driving unit (or a scan driver) 20, a data driving unit (or a data driver) 30, and a control unit (or a controller) 40. The scan driving unit 20, the data driving unit 30, and the control unit 40 may be respectively formed in individual semiconductor chips or may be integrated in one semiconductor chip. The scan driving unit 20 may be formed on the same substrate as the display unit 10.

The display unit 10 includes the pixels that are located at crossings of a plurality of scan lines SL0 to SLn, a plurality of data lines DL1 to DLm, and a plurality of emission control lines EL1 to ELn and are arranged in a substantially matrix form.

Each pixel is connected to two of the scan lines SL0 to SLn. In FIG. 1, each pixel is illustrated as connected to a scan line of a corresponding pixel line and a scan line of a previous pixel line but is not necessarily limited thereto.

Each pixel is connected to one of the data lines DL1 to DLm and one of the emission control lines EL1 to ELn. In addition, each pixel is connected to one of a plurality of initialization voltage lines VL which supplies an initialization voltage and one of a plurality of driving voltage lines PL which supplies a first power source voltage ELVDD.

Two adjacent pixels share an initialization voltage line VL extending in substantially the same direction as the scan lines SL0 to SLn, i.e., a first direction (or a row direction, a width direction, or a horizontal direction).

Two driving voltage lines PL that are respectively adjacent to two adjacent pixels and arranged in a second direction (or a column direction, a length direction, or a vertical direction) are separated by a predetermined distance from each other and are substantially parallel to each other. Similar to the driving voltage lines PL, the data lines DL1 to DLm arranged in the second direction are separated from each other and are substantially parallel to each other.

The scan driving unit 20 generates two corresponding scan signals and transmits the two corresponding scan signals to each pixel through the scan lines SL0 to SLn. That is, the scan driving unit 20 transmits a first scan signal Sn to each pixel through a first scan line SLn connected to the pixels of the current row line and transmits a second scan signal Sn−1 through the previous scan line SLn−1 of the previous row line. For example, the scan driving unit 20 transmits the first scan signal Sn to a pixel, which is disposed on an nth row line and an mth column line, through an nth scan line SLn and transmits the second scan signal Sn−1 to the pixel through an (n−1)th scan line SLn−1. In addition, the scan driving unit 20 generates a plurality of emission control signals EM1 to EMn and transmits the emission control signals EM1 to EMn to the pixels through the emission control lines EL1 to ELn. Although it has been described in the current embodiment that scan signals and emission control signals are generated by the same scan driving unit 20, but the described technology is not limited thereto. According to some embodiments, the display apparatus 100 may further include an emission control driving unit, wherein the emission control driving unit generates the emission control signals.

The data driving unit 30 transmits a plurality of data signals D1 to Dm to the pixels through the data lines DL1 to DLm.

The control unit 40 converts a plurality of image signals R, G, and B received from an external source into a plurality of image data signals DR, DG, and DB and transmits the image data signals DR, DG, and DB to the data driving unit 30. In addition, the control unit 40 receives a vertical synchronization signal Vsync, a horizontal synchronization signal Hsync, and a clock signal MCLK, generates control signals for controlling the scan driving unit 20 and the data driving unit 30, and transmits the control signals to the scan driving unit 20 and the data driving unit 30. That is, the control unit 40 generates a scan driving control signal SCS and an emission driving control signal ECS for controlling the scan driving unit 20 and a data driving control signal DCS for controlling the data driving unit 30 and transmits the scan driving control signal SCS and the emission driving control signal ECS to the scan driving unit 20 and transmits the data driving control signal DCS to the data driving unit 30.

Each of the pixels emits light of predetermined brightness based on a driving current (Ioled: refer to FIG. 2) supplied to an OLED in response to the data signals D1 to Dm transmitted through the data lines DL1 to DLm.

Figure 2:
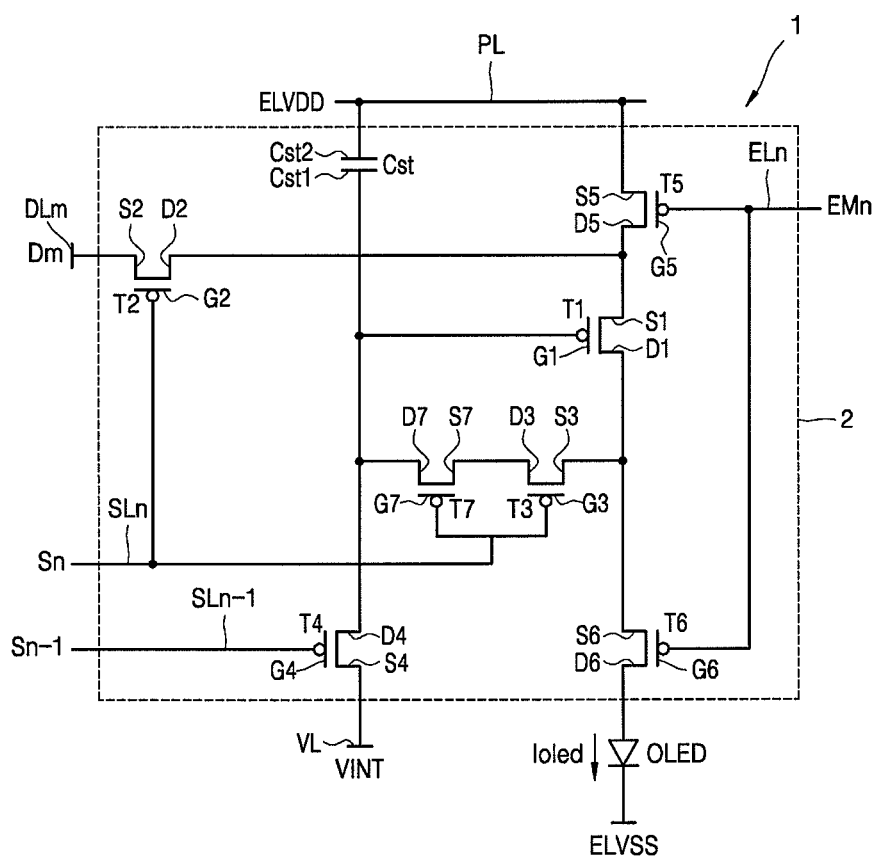
FIG. 2 is an equivalent circuit diagram of one pixel in an OLED display according to an embodiment.
Figure 3:
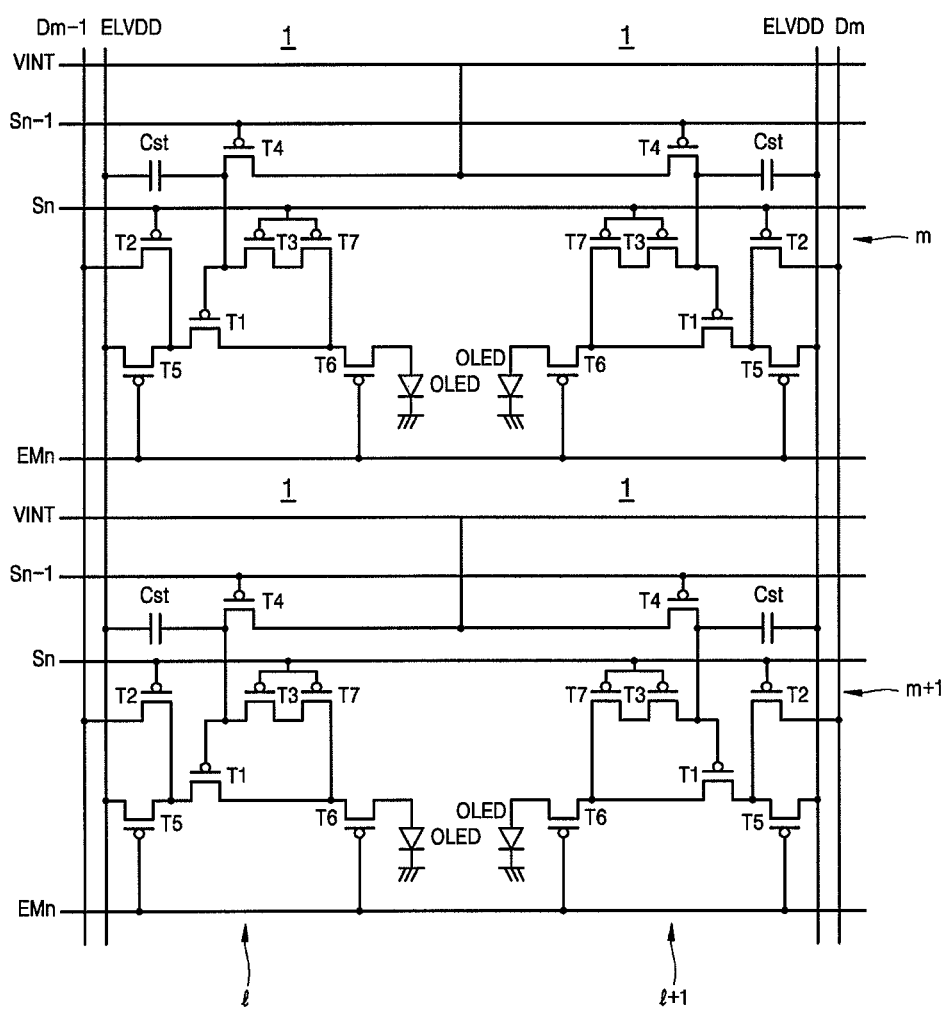
FIG. 3 is an arrangement diagram of four pixels that are adjacently disposed in an OLED display according to an embodiment.

FIG. 2 is an equivalent circuit diagram of one pixel 1 in an OLED display according to an embodiment, and FIG. 3 is an arrangement diagram of four pixels 1 that are adjacently disposed in an OLED display according to an embodiment.

Referring to FIGS. 2 and 3, the pixel 1 includes a pixel circuit 2 including a plurality of thin film transistors T1 to T7 and a storage capacitor Cst. In addition, the pixel 1 includes an OLED that emits light by receiving a driving voltage through the pixel circuit 2.

The thin film transistors T1 to T7 include a driving thin film transistor T1, a switching thin film transistor T2, first and second compensation thin film transistors T3 and T7, an initialization thin film transistor T4, an operation control thin film transistor T5, and an emission control thin film transistor T6.

The pixel 1 includes a first scan line SLn for transmitting a first scan signal Sn to the switching thin film transistor T2 and first and second compensation thin film transistors T3 and T7 and a second scan line SLn−1 for transmitting a second scan signal Sn−1 that is a previous scan signal to the initialization thin film transistor T4. The pixel 1 also includes an emission control line ELn for transmitting an emission control signal EMn to the operation control thin film transistor T5 and the emission control thin film transistor T6 and a data line DLm that crosses the first scan line SLn and transmits a data signal Dm. The pixel 1 further includes a driving voltage line PL that transmits the first power source voltage ELVDD and is formed substantially parallel to the data line DLm and an initialization voltage line VL that transmits an initialization voltage VINT for initializing the driving thin film transistor T1 and is formed substantially parallel to the second scan line SLn−1.

A gate electrode G1 of the driving thin film transistor T1 is connected to a first electrode Cst1 of the storage capacitor Cst. A source electrode S1 of the driving thin film transistor T1 is connected to the driving voltage line PL via the operation control thin film transistor T5. A drain electrode D1 of the driving thin film transistor T1 is electrically coupled to an anode electrode of the OLED via the emission control thin film transistor T6. The driving thin film transistor T1 supplies a driving current Ioled to the OLED in response to the data signal Dm received from the switching thin film transistor T2.

A gate electrode G2 of the switching thin film transistor T2 is connected to the first scan line SLn. A source electrode S2 of the switching thin film transistor T2 is connected to the data line DLm. A drain electrode D2 of the switching thin film transistor T2 is connected to the source electrode S1 of the driving thin film transistor T1 and is connected to the driving voltage line PL via the operation control thin film transistor T5. The switching thin film transistor T2 is turned on in response to the first scan signal Sn received through the first scan line SLn and performs a switching operation for delivering the data signal Dm received through the data line DLm to the source electrode S1 of the driving thin film transistor T1.

The first and second compensation thin film transistors T3 and T7 form a double-gate structure, and gate electrodes G3 and G7 thereof are connected to the first scan line SLn. A source electrode S3 of the first compensation thin film transistor T3 is connected to the drain electrode D1 of the driving thin film transistor T1 and is connected to the anode electrode of the OLED via the emission control thin film transistor T6. A drain electrode D7 of the second compensation thin film transistor T7 is connected to the first electrode Cst1 of the storage capacitor Cst, a drain electrode D4 of the initialization thin film transistor T4, and the gate electrode G1 of the driving thin film transistor T1. The first and second compensation thin film transistors T3 and T7 are turned on in response to the first scan signal Sn received through the first scan line SLn and connect the gate electrode G1 and the drain electrode D1 of the driving thin film transistor T1 to each other, thereby causing the driving thin film transistor T1 to be in a diode connection state.

A gate electrode G4 of the initialization thin film transistor T4 is connected to the second scan line SLn−1. A source electrode S4 of the initialization thin film transistor T4 is connected to the initialization voltage line VL. The drain electrode D4 of the initialization thin film transistor T4 is connected to the first electrode Cst1 of the storage capacitor Cst, a drain electrode D7 of the second compensation thin film transistor T7, and the gate electrode G1 of the driving thin film transistor T1. The initialization thin film transistor T4 is turned on in response to the second scan signal Sn−1 received through the second scan line SLn−1 and delivers the initialization voltage VINT to the gate electrode G1 of the driving thin film transistor T1 to thereby initialize a voltage of the gate electrode G1 of the driving thin film transistor T1.

A gate electrode G5 of the operation control thin film transistor T5 is connected to the emission control line ELn, and a source electrode S5 of the operation control thin film transistor T5 is connected to the driving voltage line PL. A drain electrode D5 of the operation control thin film transistor T5 is connected to the source electrode S1 of the driving thin film transistor T1 and the drain electrode D2 of the switching thin film transistor T2. The operation control thin film transistor T5 is turned on in response to the emission control signal EMn received through the emission control line ELn and delivers the first power source voltage ELVDD to the driving thin film transistor T1.

A gate electrode G6 of the emission control thin film transistor T6 is connected to the emission control line ELn. A source electrode S6 of the emission control thin film transistor T6 is connected to the drain electrode D1 of the driving thin film transistor T1 and the source electrode S3 of the first compensation thin film transistor T3. A drain electrode D6 of the emission control thin film transistor T6 is electrically coupled to the anode electrode of the OLED. The operation control thin film transistor T5 and the emission control thin film transistor T6 are substantially simultaneously turned on in response to the emission control signal EMn received through the emission control line ELn and deliver the first power source voltage ELVDD to the OLED, thereby causing the driving current Ioled to flow through the OLED.

A second electrode Cst2 of the storage capacitor Cst is connected to the driving voltage line PL. The first electrode Cst1 of the storage capacitor Cst is connected to the gate electrode G1 of the driving thin film transistor T1, the drain electrode D7 of the second compensation thin film transistor T7, and the drain electrode D4 of the initialization thin film transistor T4.

A cathode electrode of the OLED is connected to a second power source voltage ELVSS. The OLED displays an image by receiving the driving current Ioled from the driving thin film transistor T1 and emitting light. The first power source voltage ELVDD may be a predetermined high-level voltage, and the second power source voltage ELVSS may be a voltage lower than the first power source voltage ELVDD or may be a ground voltage.

Referring to FIG. 3, the pixels 1 are disposed in mth and (m+1)th rows and lth and (l+1)th columns. The initialization voltage line VL for supplying the initialization voltage VINT, the first scan line SLn for delivering the first scan signal Sn, the second scan line SLn−1 for delivering the second scan signal Sn−1, and the emission control line ELn for delivering the emission control signal EMn are formed substantially parallel to each other in the first direction which is the row direction. Data lines DLm−1 and DLm and driving voltage lines PL are formed substantially parallel to each other in the second direction which is the column direction orthogonal to the row direction.

The two adjacent pixels 1 disposed in the mth row share the initialization voltage line VL. The data lines DLm−1 and DLm and the driving voltage lines PL are formed separated by a predetermined distance from each other and substantially parallel to each other. Likewise, the two adjacent pixels 1 disposed in the (m+1)th row share the initialization voltage line VL.

According to an embodiment, every two adjacent pixels 1 may share the initialization voltage line VL. Accordingly, the data line DLm−1 and the driving voltage line PL disposed in the length direction for the left pixel 1 may be disposed at the left side of the left pixel 1, and the data line DLm and the driving voltage line PL disposed in the length direction for the right pixel 1 may be disposed at the right side of the right pixel 1.

Figure 5:
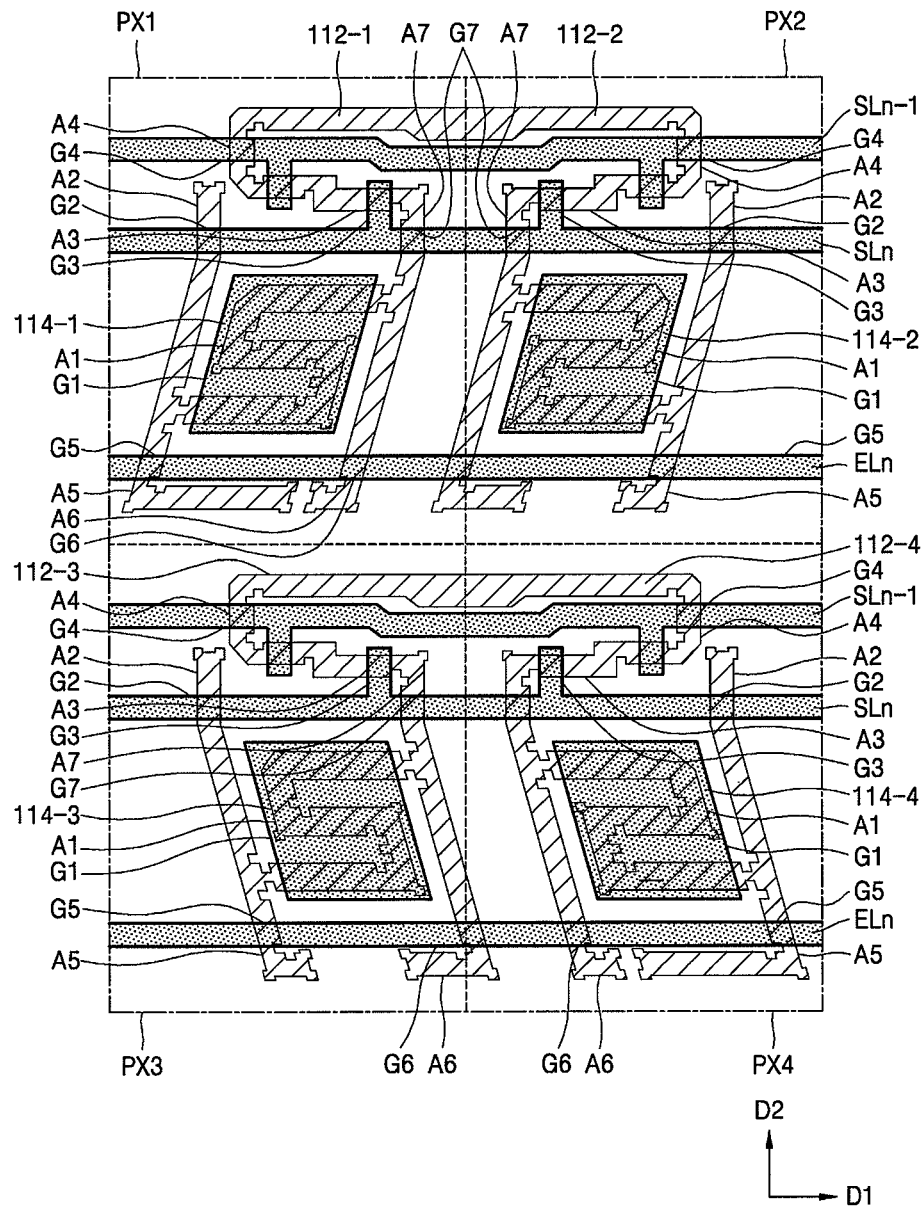
Figure 6:
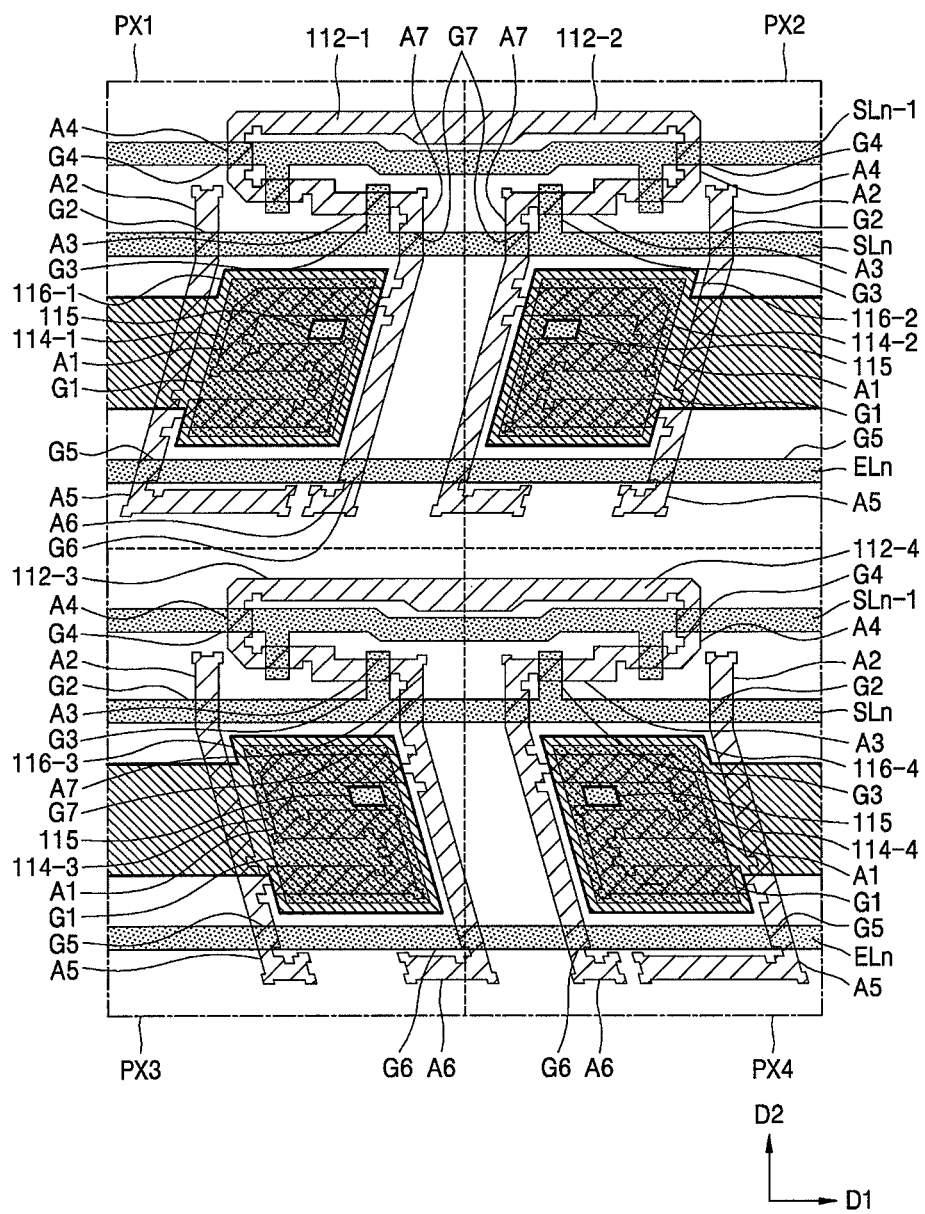
Figure 7:
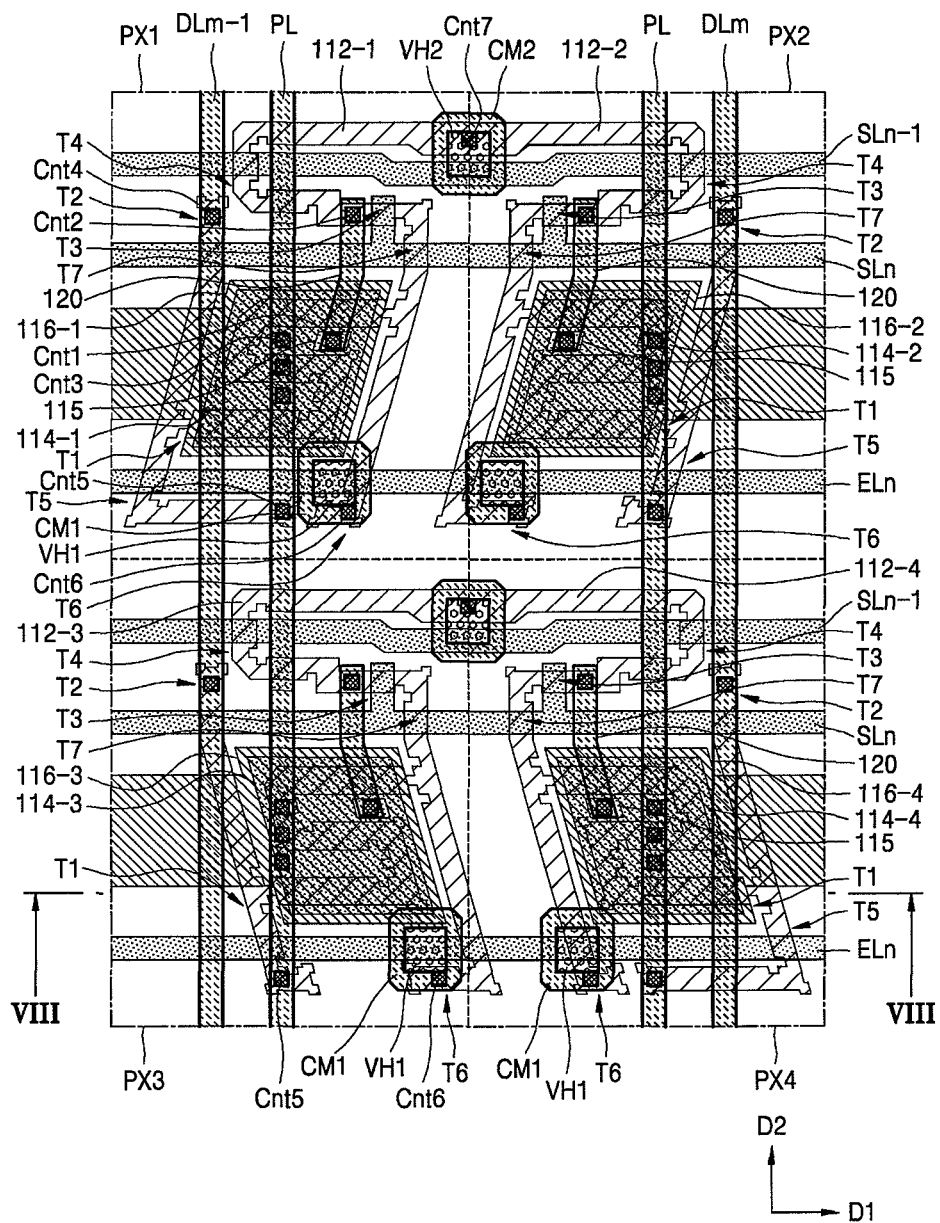
Figure 8:
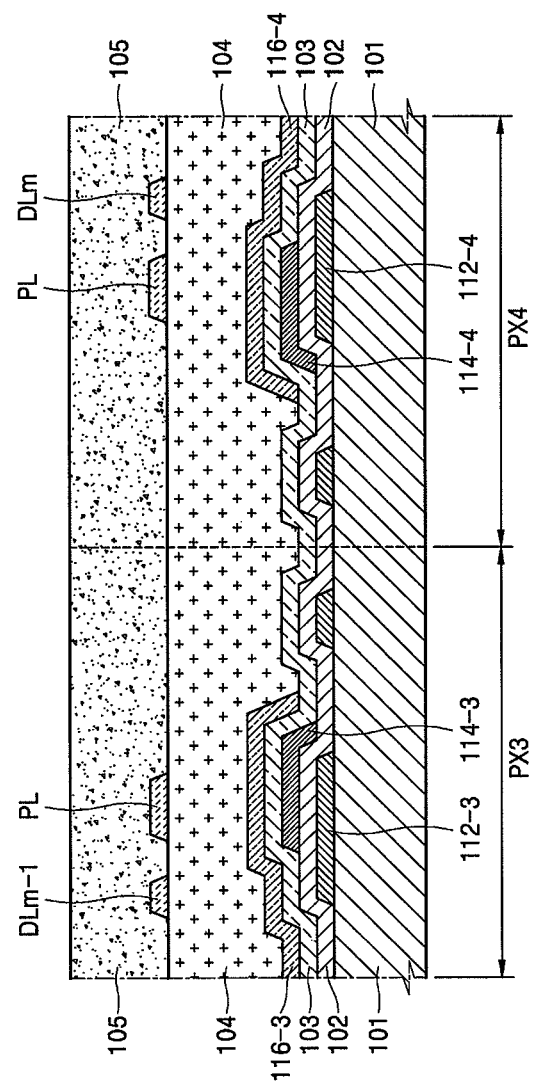

FIGS. 4 to 7 illustrate steps for forming four pixel circuits that are adjacently disposed in an OLED display according to an embodiment, and FIG. 8 is a cross-sectional view along line VIII-VIII of FIG. 7.

Referring to FIGS. 4 to 8, a first pixel PX1 and a second pixel PX2 form an mth row, a third pixel PX3 and a fourth pixel PX4 form an (m+1)th row on a substrate 101. The first pixel PX1 and the third pixel PX3 form an lth column, and the second pixel PX2 and the fourth pixel PX4 form an (l+1)th column.

Figure 4:
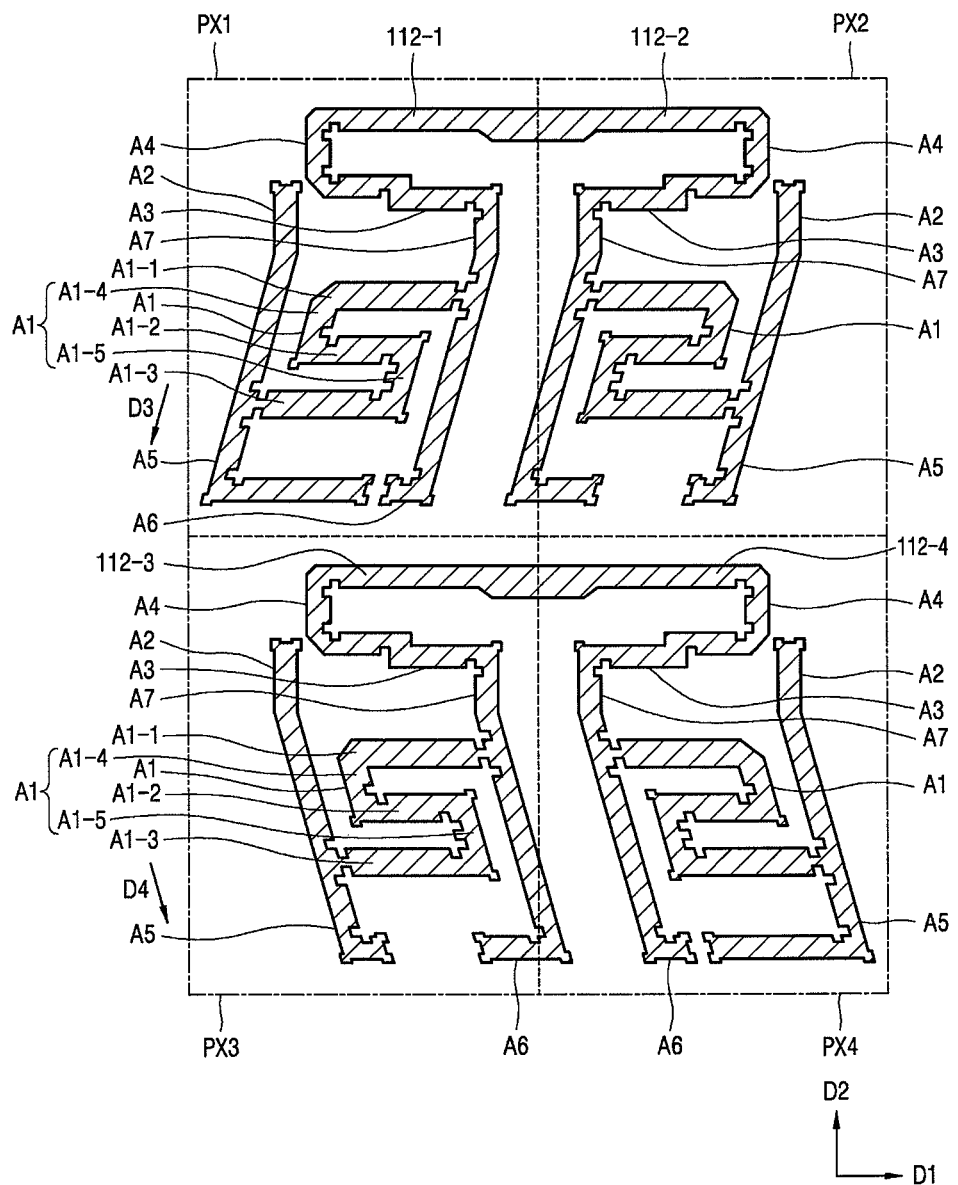
FIGS. 4 to 9 illustrate operations of forming four pixels circuits that are adjacently disposed in an OLED display according to an embodiment.

Referring to FIGS. 4 and 8, first and second active layers 112-1 and 112-2 of the first pixel PX1 and the second pixel PX2 are respectively formed on the substrate 101. Likewise, third and fourth active layers 112-3 and 112-4 of the third pixel PX3 and the fourth pixel PX4 are respectively formed on the substrate 101.

The first active layer 112-1 of the first pixel PX1 and the second active layer 112-2 of the second pixel PX2 are coupled to each other. Thus, the initialization voltage VINT applied through the initialization voltage line VL may be delivered to the first pixel PX1 and the second pixel PX2. An active region between the first pixel PX1 and the second pixel PX2 is coupled to the initialization voltage line VL in a later step.

Likewise, the third active layer 112-3 of the third pixel PX3 and the fourth active layer 112-4 of the fourth pixel PX4 are coupled to each other. Thus, the initialization voltage VINT applied through the initialization voltage line VL may be delivered to the third pixel PX3 and the fourth pixel PX4. An active region between the third pixel PX3 and the fourth pixel PX4 is coupled to the initialization voltage line VL in a later step.

The first to fourth active layers 112-1 to 112-4 may be formed of a non-crystalline silicon layer, a multi-crystalline silicon layer, or an oxide semiconductor layer, such as an $(In_2O_3)_a(Ga_2O_3)_b(ZnO)_c$ layer (G-I-Z-O layer) (here, a, b, and c are real numbers that satisfy the conditions a≥0, b≥0, and c>0).

Along the first and second active layers 112-1 and 112-2 and the third and fourth active layers 112-3 and 112-4, thin film transistors T1 to T7 are formed for each pixel circuit. Along each of the first to fourth active layers 112-1 to 112-4, active layers A1 to A7 of the driving thin film transistor T1, the switching thin film transistor T2, the first compensation thin film transistor T3, the initialization thin film transistor T4, the operation control thin film transistor T5, the emission control thin film transistor T6, and the second compensation thin film transistor T7 are respectively formed. Each of the active layers A1 to A7 includes a channel region, which is not doped with impurity, and a source region and a drain region, which are formed at the both sides of the channel region and doped with impurities. The impurities used varies according to a type of a thin film transistor employed and may be N-type or P-type impurities.

The first and second active layers 112-1 and 112-2 and the third and fourth active layers 112-3 and 112-4 are serpentinely formed in various shapes.

In particular, the active layer A1 of the driving thin film transistor T1 serpentinely extends along an incline with respect to the second direction. For example, the active layers A1 of the first and second active layers 112-1 and 112-2 may have an S shape along a third direction inclined by an acute angle with respect to the second direction. The active layers A1 of the third and fourth active layers 112-3 and 112-4 may have an S shape along a fourth direction inclined by an acute angle with respect to the second direction.

In more detail, each of the active layers A1 of the driving thin film transistors T1 disposed in the mth row may have an S shape consisting of first to third regions A1-1, A1-2, and A1-3 extending along the first direction substantially parallel to each other. Each of the active layers A1 may further include a fourth region A1-4 extending along the third direction inclined with respect to the second direction electrically coupling one end of the first region A1-1 to one end of the second region A1-2 and a fifth region A1-5 extending along the third direction electrically coupling the other end of the second region A1-2 to one end of the third region A1-3.

Each of the active layers A1 of the driving thin film transistors T1 disposed in the (m+1)th row may have an S shape consisting of first to third regions A1-1 to A1-3 extending along the first direction substantially parallel to each other, a fourth region A1-4 extending along the fourth direction inclined with respect to the second direction electrically coupling one end of the first region A1-1 to one end of the second region A1-2, and a fifth region A1-5 extending along the fourth direction electrically coupling the other end of the second region A1-2 to one end of the third region A1-3.

The third direction and the fourth direction may form a chevron structure/shape. Thus, the active layers A1 of the driving thin film transistors T1 of the first and third pixels PX1 and PX3 that are two adjacent pixels in the lth column may also form a chevron structure, and the active layers A1 of the driving thin film transistors T1 of the second and fourth pixels PX2 and PX4 that are two adjacent pixels in the (l+1)th column may also form a chevron structure. For example, the serpentinely extending shape of the active layer A1 of the first pixel PX1 and the serpentinely extending shape of the active layer A1 of the third pixel PX3 may form a chevron structure. Likewise, the serpentinely extending shape of the active layer A1 of the second pixel PX2 and the serpentinely extending shape of the active layer A1 of the fourth pixel PX4 may also form a chevron structure.

By forming the active layers A1 of the first to fourth active layers 112-1 to 112-4 with a serpentine structure, the channel region may be lengthened, resulting in a relatively wide driving range of the gate voltage of the driving thin film transistor T1.

When the length of wiring is relatively long, a voltage drop due to the length of wiring is relatively large. However, according to an embodiment of the described technology, since the active layer A1 of the driving thin film transistor T1 serpentinely extends along the third direction and/or the fourth direction inclined with respect to the second direction, the length of the active layer A1 in the vertical direction (second direction) in a pixel area may be minimized while maintaining the entire length of the active layer A1. Thus, the length of the data lines Dm and Dm−1 (see FIG. 7) and the driving voltage lines PL (see FIG. 7) may be reduced, an increase in a voltage drop along the data lines Dm and Dm−1 or driving voltage lines PL may be substantially prevented, and current consumption may be improved.

As shown in FIG. 7, the data lines Dm and Dm−1 for the first and second pixels PX1 and PX2 or the third and fourth pixels PX3 and PX4 that are two adjacent pixels disposed along the first direction may be mirrored about a boundary between the two adjacent pixels. Similarly, the driving voltage lines PL for the first and second pixels PX1 and PX2 or the third and fourth pixels PX3 and PX4 that are two adjacent pixels disposed along the first direction may be mirrored about the boundary between the two adjacent pixels. For example, the data line DLm−1 and the driving voltage line PL extending in the second direction for the first and third pixels PX1 and PX3 on the left may be disposed at the left side of the first and third pixels PX1 and PX3, and the data line DLm and the driving voltage line PL extending in the second direction for the second and fourth pixels PX2 and PX4 on the right may be disposed at the right side of the second and fourth pixels PX2 and PX4.

Referring to FIGS. 5 and 8, a first insulating layer 102 is formed on the substrate 101 on which the first to fourth active layers 112-1 to 112-4 are formed. The first insulating layer 102 is a gate insulating layer and may be formed of an organic electrically insulating material or an inorganic electrically insulating material or formed in a multi-layer structure in which an organic electrically insulating material and an inorganic electrically insulating material are alternated.

A first gate wiring is formed on the first insulating layer 102. The first gate wiring may include the first scan line SLn, the second scan line SLn−1, the emission control line ELn, and first capacitor electrodes 114-1 to 114-4. The first gate wiring may include a metallic material of a low resistance, such as aluminum (Al), copper (Cu), or the like.

Each of the first capacitor electrodes 114-1 to 114-4 may also act as the gate electrode G1 of the driving thin film transistor T1. Each of the first capacitor electrodes 114-1 to 114-4 may be a floating type electrode which is separated from the first scan line SLn, the second scan line SLn−1, and the emission control line ELn, and substantially overlaps the channel region of the active layer A1 of the driving thin film transistor T1.

Since the active layer A1 of the driving thin film transistor T1 serpentinely extends along either the third direction or the fourth direction, each of the first capacitor electrodes 114-1 to 114-4 may be formed in a substantially parallelogram shape. The first scan line SLn acts as the gate electrode G2 of the switching thin film transistor T2 and the gate electrodes G3 and G7 of the first and second compensation thin film transistors T3 and T7. The second scan line SLn−1 acts as the gate electrode G4 of the initialization thin film transistor T4. The emission control line ELn acts as the gate electrode G5 of the operation control thin film transistor T5 and the gate electrode G6 of the emission control thin film transistor T6.

Referring to FIGS. 6 and 8, a second insulating layer 103 is formed on the substrate 101 on which the first gate wiring is formed. The second insulating layer 103 may function as a dielectric of the storage capacitor Cst. The second insulating layer 103 may be formed of an organic electrically insulating material or an inorganic electrically insulating material or formed in a multi-layer structure in which an organic electrically insulating material and an inorganic electrically insulating material are alternated.

A second gate wiring is formed on the second insulating layer 103. The second gate wiring may include second capacitor electrodes 116-1 to 116-4. Similarly to the first gate wiring, the second gate wiring may include a metallic material of a low resistance, such as Al, Cu, or the like.

Each of the second capacitor electrodes 116-1 to 116-4 substantially overlaps each of the first capacitor electrodes 114-1 to 114-4 to form the storage capacitor Cst. Each of the second capacitor electrodes 116-1 to 116-4 located in adjacent pixels sharing the initialization voltage VINT are separated from each other. Each of the second capacitor electrodes 116-1 to 116-4 located in adjacent pixels with respect to the data line DLm−1 or DLm are coupled to each other.

Each of the second capacitor electrodes 116-1 to 116-4 includes a storage aperture 115. The storage aperture 115 may be formed in a closed-loop shape. According to the shape of the second capacitor electrodes 116-1 to 116-4, even though an overlay variation may occur between each of the first capacitor electrodes 114-1 to 114-4 and each of the second capacitor electrodes 116-1 to 116-4, each storage capacitor Cst may have a consistent capacitance. The overlay variation refers to the difference in the overlapping regions from the original design for the overlapping regions if any of two or more layers overlapping each other are shifted in any direction when the layers overlapping each other are formed.

Referring to FIGS. 7 and 8, a third insulating layer 104 is formed on the substrate 101 on which the second gate wiring is formed. Like the first and second insulating layers 102 and 103, the third insulating layer 104 may be formed of an organic electrically insulating material or an inorganic electrically insulating material or formed in a multi-layer structure in which an organic electrically insulating material and an inorganic electrically insulating material are alternated.

A first contact hole Cnt1 is formed in the second insulating layer 103 and the third insulating layer 104 to expose each of the first capacitor electrodes 114-1 to 114-4 through the aperture 115 of each of the second capacitor electrodes 116-1 to 116-4. A third contact hole Cnt3 is formed in the third insulating layer 104 to expose each of the second capacitor electrodes 116-1 to 116-4.

First to sixth contact holes Cnt1 to Cnt6 are formed in corresponding regions of each of the first to fourth pixels PX1 to PX4.

The second contact hole Cnt2 is formed in the first to third insulating layers 102 to 104 to expose the drain region of the active layer A3 of the first compensation thin film transistor T3 and the drain region of the active layer A4 of the initialization thin film transistor T4.

The fourth contact hole Cnt4 is formed in the first to third insulating layers 102 to 104 to expose the source region of the active layer A2 of the switching thin film transistor T2. The fifth contact hole Cnt5 is formed in the first to third insulating layers 102 to 104 to expose the active layer A5 of the operation control thin film transistor T5. The sixth contact hole Cnt6 is formed in the first to third insulating layers 102 to 104 to expose the active layer A6 of the emission control thin film transistor T6.

In addition, a seventh contact hole Cnt7 is formed in the first to third insulating layers 102 to 104 to expose a region in which the first active layer 112-1 of the first pixel PX1 and the second active layer 112-2 of the second pixel PX2 are electrically coupled to each other. The seventh contact hole Cnt7 is also formed in the first to third insulating layers 102 to 104 to expose a region in which the third active layer 112-3 of the third pixel PX3 and the fourth active layer 112-4 of the fourth pixel PX4 are electrically coupled to each other.

On the third insulating layer 104, the data lines DLm−1 and DLm, the driving voltage lines PL, and a connection wiring 120 for connecting the first contact hole Cnt1 and the second contact hole Cnt2 are formed along the second direction. A first cover metal CM1 for covering the sixth contact hole Cnt6, and a second cover metal CM2 for covering the seventh contact hole Cnt7 are also formed on the third insulating layer 104.

The data line DLm or DLm−1 extends along the second direction for every pixel. The data line DLm or DLm−1 is connected to the switching thin film transistor T2 through the fourth contact hole Cnt4. The data lines DLm−1 and DLm may be disposed to be substantially symmetrically mirrored about the boundary between the adjacent first and second pixels PX1 and PX2 or the boundary between the adjacent third and fourth pixels PX3 and PX4.

The driving voltage line PL is separated by a predetermined distance from the data line DLm or DLm−1 and extends along the second direction. The driving voltage lines PL may be disposed to be substantially symmetrically mirrored about the boundary between the adjacent first and second pixels PX1 and PX2 or the boundary between the adjacent third and fourth pixels PX3 and PX4.

The connection wiring 120 connects each of the first capacitor electrodes 114-1 to 114-4, the first compensation thin film transistor T3, and the initialization thin film transistor T4.

The data lines DLm−1 and DLm, the driving voltage lines PL, the connection wiring 120, the first cover metal CM1, and the second cover metal CM2 may be formed on the same layer and may be formed of the same material.

A protective film 105 may be formed on the substrate 101 on which the data lines DLm−1 and DLm, the driving voltage lines PL, the connection wiring 120, the first cover metal CM1, and the second cover metal CM2 are formed. First and second via holes VH1 and VH2 are formed in the protective film 105 to respectively expose portions of the first cover metal CM1 and the second cover metal CM2. The first and second via holes VH1 and VH2 may be formed of the same material. By commonly forming the second via hole VH2 for the first and second pixels PX1 and PX2 that are two adjacent pixels, an aperture ratio may be improved when compared to the case where the second via hole VH2 is formed for each pixel.

Figure 9:
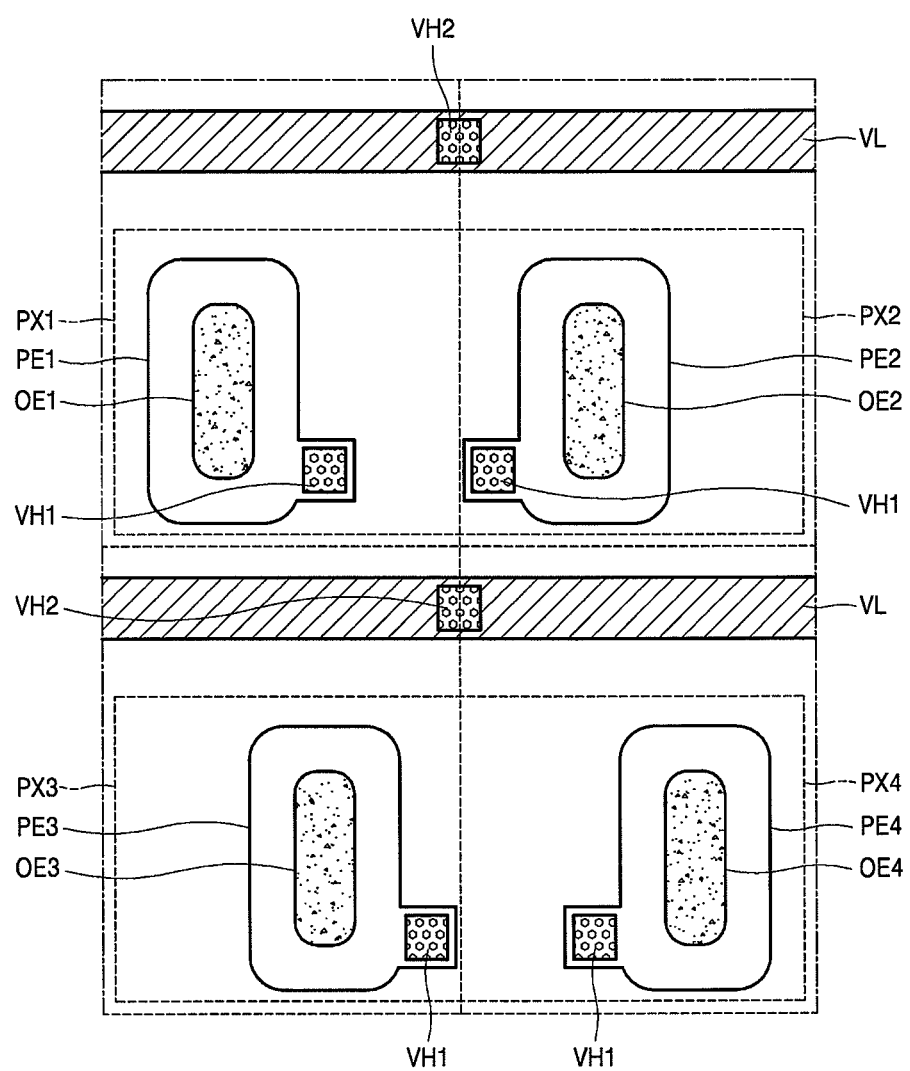

Referring to FIG. 9, pixel electrodes PE1 to PE4 and the initialization voltage line VL are formed on the protective film 105. Each of the pixel electrodes PE1 to PE4 is electrically coupled to the emission control thin film transistor T6 through the first via hole VH1.

The initialization voltage line VL disposed in the mth row is coupled to the initialization thin film transistors T4 of the first and second pixels PX1 and PX2 through the second via hole VH2 that is commonly formed for the first and second pixels PX1 and PX2 to thereby deliver the initialization voltage VINT to the first and second pixels PX1 and PX2 at substantially the same time.

The initialization voltage line VL disposed in the (m+1)th row is coupled to the initialization thin film transistors T4 of the third and fourth pixels PX3 and PX4 through the second via hole VH2 that is commonly formed for the third and fourth pixels PX3 and PX4 to thereby deliver the initialization voltage VINT to the third and fourth pixels PX3 and PX4 at substantially the same time.

The initialization voltage lines VL may be formed on the same layer as the pixel electrodes PE1 to PE4 and formed of the same material as the pixel electrodes PE1 to PE4.

Although not shown, a pixel defining layer may be formed on edges of the pixel electrodes PE1 to PE4 and the protective film 105. Organic layers OE1, to OE4 and opposite electrodes are respectively formed on the pixel electrodes PE1 to PE4 exposed by the pixel defining layer.

When each of the pixel electrodes PE1 to PE4 is used as an anode electrode, each of the pixel electrodes PE1 to PE4 may include a layer formed of a metal oxide having a high absolute value of a work function, such as an indium tin oxide (ITO), an indium zinc oxide (IZO), an zinc oxide (ZnO), or the like. When each of the pixel electrodes PE1 to PE4 is used as a cathode electrode, a high-conductive metal having a low absolute value of a work function, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or the like, may be used. When each of the pixel electrodes PE1 to PE4 is used as an anode electrode, the corresponding opposite electrode is used as a cathode electrode, and when each of the pixel electrodes PE1 to PE4 is used as a cathode electrode, the corresponding opposite electrode is used as an anode electrode.

Each of the organic layers OE1 to OE4 may be formed by stacking an organic emission layer (EML) and one or more of other function layers, such as a hole transport layer (HTL), a hole injection layer (HIL), an electron transport layer (ETL), an electron injection layer (EIL), or the like, in a single or complex structure.

When a display apparatus is a top emission type, each of the pixel electrodes PE1 to PE4 may be a reflective electrode, and the corresponding opposite electrode may be a light-transmissive electrode. In this case, the opposite electrode may include a half-transmissive reflective film formed as a thin film of Ag, Mg, Al, Pt, Pd, Au, Ni, Nd, Ir, Cr, Li, Ca, or the like or a light-transmissive metal oxide, such as ITO, IZO, ZnO, or the like.

In an LCD, the wiring structure between a substrate and a pixel electrode has an influence on the transmissivity due to the driving mechanism thereof. However, according to at least one embodiment of the described technology, when the OLED display 100 is a top emission type, since light emitted by the organic layers OE1 to OE4 is emitted through the opposite electrodes, the transmissivity may be maintained regardless of the structure below the pixel defining layer.

Thus, according to at least one embodiment, by forming the active layers A1 of the driving thin film transistors T1 along the third and fourth directions with a serpentine structure and forming the active layers A1 of the driving thin film transistors T1 with chevron structure with respect to adjacent active layers A1, the current consumption of the OLED display may be improved while substantially preventing degradation of the transmissivity and minimizing the length of the active layer A1 in the vertical direction (second direction) in the pixel area.

Figure 10:
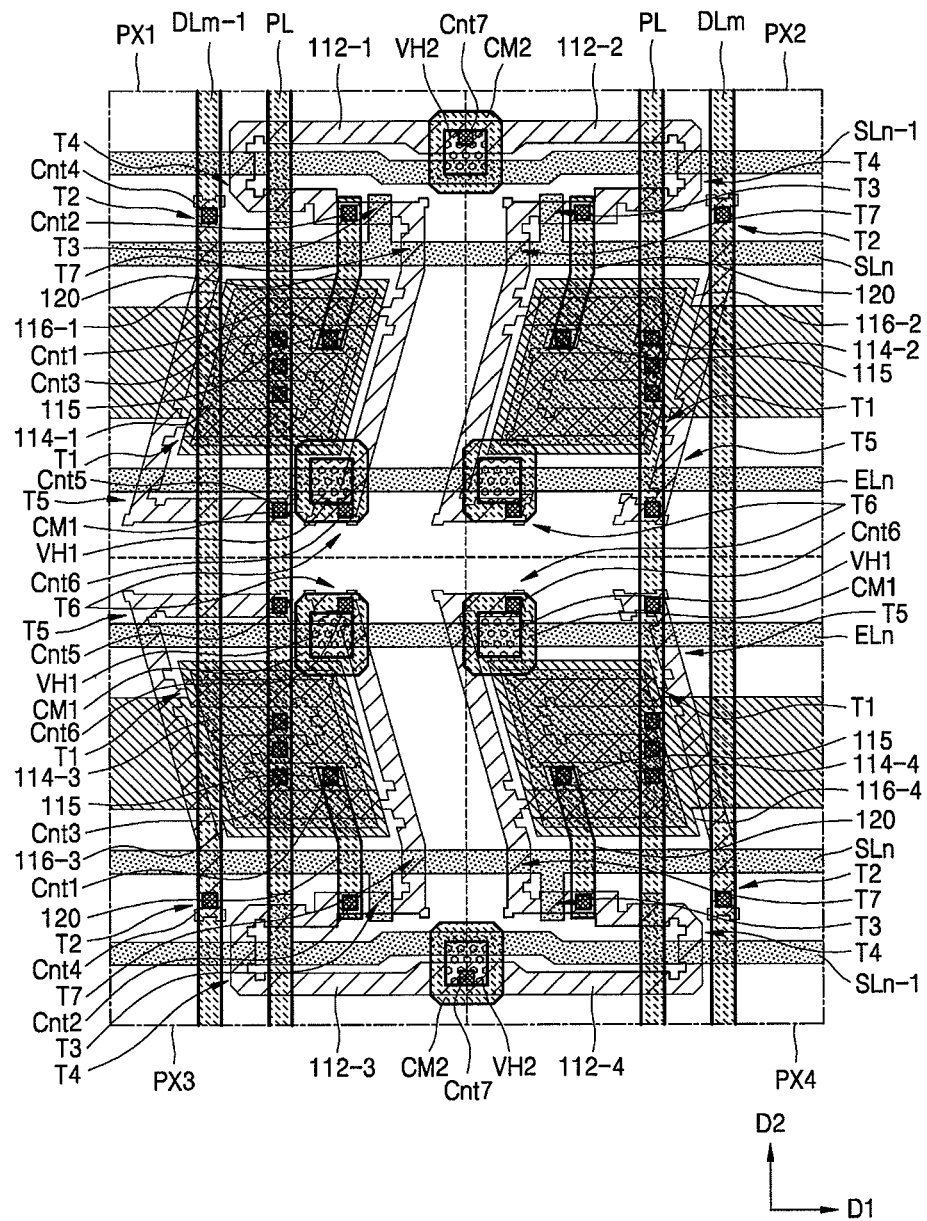
FIG. 10 is an arrangement diagram of four pixels that are adjacently disposed in an OLED display apparatus according to another embodiment.

FIG. 10 is an arrangement diagram of four pixels that are adjacently disposed in an OLED display according to another embodiment.

Referring to FIG. 10, a first pixel PX1 and a second pixel PX2 form an mth row, a third pixel PX3 and a fourth pixel PX4 form an (m+1)th row, the first pixel PX1 and the third pixel PX3 form an 1th column, and the second pixel PX2 and the fourth pixel PX4 form an (l+1)th column. The first and second pixels PX1 and PX2 that are adjacent in the mth row may be substantially symmetrically mirrored with respect to a boundary therebetween. Similarly, the third and fourth pixels PX3 and PX4 that are adjacent in the (m+1)th row may be substantially symmetrically mirrored about a boundary therebetween.

Each pixel includes the first scan line SLn for delivering the first scan signal Sn to the switching thin film transistor T2 and the first and second compensation thin film transistors T3 and T7, the second scan line SLn−1 for delivering the second scan signal Sn−1 that is a previous scan signal to the initialization thin film transistor T4, and the emission control line ELn for delivering the emission control signal EMn to the operation control thin film transistor T5 and the emission control thin film transistor T6. Each pixel also includes the data line DLm that crosses the first scan line SLn and delivers the data signal Dm, the driving voltage line PL that delivers the first power source voltage ELVDD and is formed substantially parallel to the data line DLm, and the initialization voltage line VL that delivers the initialization voltage VINT for initializing the driving thin film transistor T1 and is formed substantially parallel to the second scan line SLn−1.

In the current embodiment, the first active layer 112-1 of the first pixel PX1 and the second active layer 112-2 of the second pixel PX2 are electrically coupled to each other, and the third active layer 112-3 of the third pixel PX3 and the fourth active layer 112-4 of the fourth pixel PX4 are also electrically coupled to each other. Thus, the initialization voltage VINT applied through each of the initialization voltage lines VL may be delivered to the first and second pixels PX1 and PX2, and the third and fourth pixels PX3 and PX4.

The first and second active layers 112-1 and 112-2 and the third and fourth active layers 112-3 and 112-4 are serpentinely formed. The active layer A1 of the driving thin film transistor T1 serpentinely extends along an inclined direction with respect to the second direction. For example, the active layers A1 of the first and second active layers 112-1 and 112-2 may have an S shape along the third direction inclined by an acute angle with respect to the second direction. The active layers A1 of the third and fourth active layers 112-3 and 112-4 may have an S shape along the fourth direction inclined by an acute angle with respect to the second direction.

In this case, the third direction and the fourth direction may form a chevron structure/shape. Thus, the active layers A1 of the driving thin film transistors T1 of the first and third pixels PX1 and PX3 that are two adjacent pixels in the 1th column may also form a chevron structure, and the active layers A1 of the driving thin film transistors T1 of the second and fourth pixels PX2 and PX4 that are two adjacent pixels in the (l+1)th column may also form a chevron structure. For example, the serpentinely extending shape of the active layer A1 of the first pixel PX1 and the serpentinely extending shape of the active layer A1 of the third pixel PX3 may form a chevron structure. Likewise, the serpentinely extending shape of the active layer A1 of the second pixel PX2 and the serpentinely extending shape of the active layer A1 of the fourth pixel PX4 may also form a chevron structure.

As described above, by forming the active layer A1 of the driving thin film transistor T1 with a serpentine structure, the channel region may be lengthened, resulting in a relatively wide a driving range of the gate voltage of the driving thin film transistor T1.

In addition, since the active layer A1 of the driving thin film transistor T1 serpentinely extends along the third direction and/or the fourth direction inclined with respect to the second direction, the length of the active layer A1 in the vertical direction (second direction) in a pixel area may be minimized while maintaining the length of the active layer A1. Furthermore, the length of the data lines Dm and Dm−1 and the driving voltage lines PL may be reduced, an increase in a voltage drop along the data lines Dm Dm−1 may be substantially prevented, and current consumption may be improved as described above.

According to at least one embodiment, an active layer is serpentinely formed along an inclined direction with respect to a driving voltage line for supplying a power source voltage ELVDD and a data line, thereby reducing the wiring length of the driving voltage line and improving current consumption.

In addition, according to at least one embodiment, each adjacent active layer is formed in a different inclined direction so that the active layers of driving thin film transistors that are adjacently disposed in a column direction form a chevron structure, thereby reducing the occurrence of stains [We recommend more clearly identifying what is reduced by the formation of a chevron structure since it is unclear what is meant by the "occurrence of stains"].

While the described technology has been particularly shown and described with reference to exemplary embodiments thereof, it will be understood by those of ordinary skill in the art that various changes in form and details may be made therein without departing from the spirit and scope of the described technology as defined by the following claims.

What is claimed is:

1. An organic light-emitting diode (OLED) display comprising:
   a plurality of scan lines extending in a first direction;
   a plurality of data lines extending in a second direction crossing the first direction;
   a plurality of pixels electrically connected to the scan lines and the data lines, wherein the pixels are arranged in a plurality of rows and a plurality of columns, and wherein each pixel comprises an OLED and a thin film transistor including an active layer electrically connected to the OLED; and
   a plurality of driving voltage lines configured to supply a driving voltage to each of the pixels, wherein the driving voltage lines extend in the second direction,
   wherein the pixels comprise a first pixel, a second pixel adjacent to the first pixel in the first direction, and a third pixel adjacent to the first pixel in the second direction, wherein each of the first, second and third pixels comprises a thin film transistor including an active layer that has a substantially S shape, and wherein the active layer of the first pixel extends in a third direction inclined with respect to the second direction, wherein the active layer of the third pixel extends in a fourth direction inclined with respect to the second direction and different from the third direction, and wherein the active layer of the second pixel extends in the third direction.

2. The OLED display of claim 1, wherein the active layer comprises:
   first, second, and third regions extending in the first direction;
   a fourth region extending in the third direction and electrically connecting the first region to the second region; and a fifth region extending in the third direction and electrically connecting the second region to the third region.

3. The OLED display of claim 1, wherein the third direction forms an acute angle with the second direction.

4. The OLED display of claim 1, wherein the pixels comprise a plurality of first pixels and a plurality of second pixels adjacent to each other in the second direction, wherein the first and second pixels respectively comprise first and second active layers, wherein the first active layers extend in the third direction and the second active layers extend in a fourth direction inclined with respect to the second direction, and wherein the third and fourth directions form a substantially chevron shape.

5. The OLED display of claim 1, wherein the data lines for two pixels adjacent to each other in the first direction are substantially symmetrically mirrored about a boundary between the two adjacent pixels.

6. The OLED display of claim 1, wherein the driving voltage lines for two pixels adjacent to each other in the first direction are substantially symmetrically mirrored about a boundary between the two adjacent pixels.

7. The OLED display of claim 1, wherein the rows include first and second rows adjacent to each other in the second direction, wherein the active layers of the first row extend in the third direction, and wherein the active layers of the second row extend in a fourth direction inclined with respect to the second direction.

8. The OLED display of claim 7, wherein the third direction and the fourth direction form a substantially chevron shape.

9. The OLED display of claim 1, further comprising a driving thin film transistor comprising the active layer.

10. An organic light-emitting diode (OLED) display comprising:
    a plurality of scan lines extending in a first direction;
    a plurality of data lines extending in a second direction crossing the first direction;
    a plurality of pixels, each pixel comprising:
        a switching thin film transistor electrically connected to two of the scan lines and one of the data lines;
        a driving thin film transistor electrically connected to the switching thin film transistor, wherein the driving thin film transistor comprises an active layer; and
        an OLED electrically connected to the driving thin film transistor,
    wherein the pixels comprises a first pixel, a second pixel adjacent to the first pixel in the first direction, and a third pixel adjacent to the first pixel in the second direction,
    wherein each of the first, second and third pixels comprises a thin film transistor including an active layer that has a serpentine shape,
    wherein the active layer of the first pixel extends in a third direction inclined with respect to the second direction,
    wherein the active layer of the third pixel extends in a fourth direction inclined with respect to the second direction and different to the third direction, wherein the active layer of the second pixel extends in the third direction, and
    wherein the active layer is electrically connected between two adjacent pixels in the first direction.

11. The OLED display of claim 10, wherein the pixels comprise a plurality of first pixels and a plurality of second pixels adjacent to each other in the second direction, wherein the first and second pixels respectively comprise first and second active layers, wherein the first active layers extend in the third direction and the second active layers extend in a fourth direction inclined with respect to the second direction, and wherein the third and fourth directions form a substantially chevron shape.

12. The OLED display of claim 10, wherein the third direction forms an acute angle with the second direction.

13. The OLED display of claim 10, wherein the active layer comprises:
    first, second, and third regions extending in the first direction;
    a fourth region extending in the third direction and electrically connecting one end of the first region to one end of the second region; and
    a fifth region extending in the third direction and electrically connecting the other end of the second region to one end of the third region.

14. The OLED display of claim 10, wherein the pixels are arranged in a plurality of first rows and a plurality of second rows adjacent to the first rows in the second direction, wherein the active layers of the first rows extend in the third direction, and wherein the active layers of the second rows extend in a fourth direction inclined with respect to the second direction.

15. The OLED display of claim 14, wherein the third direction and the fourth direction form a substantially chevron shape.

16. The OLED display of claim 10, wherein each pixel further comprises:
    a first insulating layer substantially covering the active layer; and
    a capacitor substantially overlapping the active layer.

17. The OLED display of claim 16, wherein the capacitor comprises:
    a first capacitor electrode formed over the first insulating layer, wherein the first capacitor electrode substantially overlaps the active layer and wherein the first capacitor is configured to function as a gate electrode of the driving thin film transistor;
    a second insulating layer substantially covering the first capacitor electrode; and
    a second capacitor electrode formed over the second insulating layer, wherein at least a portion of the second capacitor electrode substantially overlaps the first capacitor electrode.

18. An organic light-emitting diode (OLED) display comprising:
    a plurality of scan lines extending in a first direction;
    a plurality of data lines extending in a second direction crossing the first direction; and
    a plurality of pixels electrically connected to the scan lines and the data lines, wherein the pixels comprise a first pixel, a second pixel adjacent to the first pixel in the first direction, and a third pixel adjacent to the first pixel in the second direction, and wherein each of the first, second and third pixels comprises at least one thin film transistor including an active layer that has a serpentine shape,
    wherein the active layer of the first pixel extends in a third direction inclined with respect to the second direction,
    wherein the active layer of the third pixel extends in a fourth direction inclined with respect to the second direction and different to the third direction, and wherein the active layer of the second pixel extends in the third direction.

19. The OLED display of claim 1, wherein the active layers of two adjacent pixels respectively have a substantially S shape and a substantially reverse S shape.

20. The OLED display of claim 10, wherein the active layer of the first pixel has a first serpentine shape, wherein the active layer of the second pixel or the third pixel has a second serpentine shape, and wherein the first and second serpentine shapes are reversed to each other.

\* \* \* \* \*